(12) United States Patent
Sung et al.

(10) Patent No.: US 9,337,101 B1
(45) Date of Patent: May 10, 2016

(54) METHODS FOR SELECTIVELY REMOVING A FIN WHEN FORMING FINFET DEVICES

(71) Applicant: GLOBALFOUNDRIES Inc., Grand Cayman (KY)

(72) Inventors: Min Gyu Sung, Latham, NY (US); Hoon Kim, Clifton Park, NM (US); Chanro Park, Clifton Park, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/674,549

(22) Filed: Mar. 31, 2015

Related U.S. Application Data

(60) Provisional application No. 62/088,049, filed on Dec. 5, 2014.

(51) Int. Cl.
*H01L 21/8234* (2006.01)
*H01L 21/308* (2006.01)
*H01L 21/3065* (2006.01)

(52) U.S. Cl.
CPC .... *H01L 21/823431* (2013.01); *H01L 21/3065* (2013.01); *H01L 21/3085* (2013.01)

(58) Field of Classification Search
CPC ............ H01L 21/3065; H01L 21/3085; H01L 21/823431
See application file for complete search history.

(56) References Cited

U.S. PATENT DOCUMENTS

2015/0206954 A1* 7/2015 Lin .................... H01L 29/66795
257/365
2016/0013183 A1* 1/2016 Basker ................ H01L 27/0886
257/401

OTHER PUBLICATIONS

Matsutani et al., "Angled etching of (001) rutile Nb-TiO2 substrate using SF6-based capacitively coupled plasma reactive ion etching," Japanese Journal of Applied Physics, 53, 06JF02, 2014.

* cited by examiner

*Primary Examiner* — Mamadou Diallo
(74) *Attorney, Agent, or Firm* — Amerson Law Firm, PLLC

(57) ABSTRACT

One illustrative method disclosed herein includes, among other things, forming a plurality of fins in a semiconducting substrate, each of which has a corresponding masking layer feature positioned thereabove, forming a masking layer that has an opening that exposes at least two fins of the plurality of fins, performing an angled etching process through the opening in the masking layer so as to remove the masking layer feature formed above one of the at least two exposed fins, and thereby define an exposed fin, while leaving the masking layer feature intact above the other of the at least two exposed fins, and performing an anisotropic etching process through the opening in the masking layer to remove the exposed fin while leaving the other of the at least two exposed fins intact.

28 Claims, 15 Drawing Sheets

US 9,337,101 B1

METHODS FOR SELECTIVELY REMOVING A FIN WHEN FORMING FINFET DEVICES

BACKGROUND OF THE INVENTION

1. Field of the Invention

Generally, the present disclosure relates to the manufacture of semiconductor devices, and, more specifically, to various methods of removing a fin when forming FinFET semiconductor devices.

2. Description of the Related Art

In modern integrated circuits, such as microprocessors, storage devices and the like, a very large number of circuit elements, especially field effect transistors (FETs), are provided and operated on a restricted chip area. Such field effect transistors (both NFETs and PFETs) operate in a switched mode, that is, these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

FETs come in a variety of configurations, planar devices, nanowire devices, FinFET devices, etc. A planar transistor device is normally manufactured in an active region of a substrate having a substantially planar upper surface. In contrast to a planar FET, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E are the source/drain regions of the device A. Unlike a planar FET, in a FinFET device, a channel is formed perpendicular to a surface of the semiconducting substrate so as to reduce the physical size of the semiconductor device.

Both planar and FinFET semiconductor devices are typically electrically isolated from adjacent transistor devices so that they can perform their intended function. This is typically accomplished by forming an isolation structure, e.g., a shallow trench isolation structure, in the semiconducting substrate around the transistor device. Traditionally, isolation structures were typically the first structure that was formed when manufacturing semiconductor devices. The isolation structures were formed by etching the trenches into the substrate for the isolation structures, and thereafter filling the trenches with the desired insulating material, e.g., silicon dioxide. After the isolation structures were formed, various process operations were performed to manufacture the transistor devices.

In the case of FinFET devices, these process operations involved masking the previously formed isolation structure, and thereafter etching the trenches into the substrate that defined the fins. However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form a plurality of "fins" that extend across the entire substrate, i.e., sometimes referred to as a "sea of fins," and thereafter remove some of the fins where larger isolation structures will be formed. Using this type of manufacturing approach, better accuracy and repeatability may be achieved in forming the fins to very small dimensions due to the more uniform environment in which the etching process that forms the trenches is performed.

There are two commonly employed techniques for accomplishing the goal of removing the desired number of fins (or portions thereof). One such removal process is typically referred to as "Fins-cut-First." In this process, one or more features of a patterned masking layer that is formed above the initial substrate is selectively exposed and removed prior to performing a fin formation etching process through the patterned masking layer. As a result, in the region where the masking feature(s) was removed from the patterned masking layer, the substrate is etched to define a wider trench that is free of any fin structures. This wider trench is then filled with an insulating material, e.g., silicon dioxide.

Another fin removal process is typically referred to as "Fins-cut-Last." In this process, a patterned masking layer with features corresponding to the desired sea-of-fins is formed above the initial surface of the substrate. Thereafter, a fin-formation etching process is performed through the patterned masking layer to form the trenches across the entire substrate and thereby define the sea-of-fins. Next, the portions of the sea-of-fins that are to be removed are exposed by another patterned masking layer and removed by performing an etching process. This defines a larger trench that is free of fin structures. The larger trench is then filled with an insulating material, such as silicon dioxide.

FIG. 1B depicts a problem that may arise when using a Fins-cut-Last fin removal process when trying to remove only a single fin so as to form a desired isolation structure between adjacent FinFET devices. FIG. 1B depicts a device 10 at a point in fabrication wherein a plurality of trenches 17 were etched into a substrate 12 so as to define a plurality of fins 13. The etching process was performed through a patterned etch mask 14. FIG. 1B also depicts the device 10 after a layer of insulating material 19 was deposited into the trenches 17, and after a CMP process was performed using the patterned etch mask 14 as a polish-stop layer. In the example depicted in FIG. 1B, it is desired to remove only the single fin 15 so as to form a portion of an isolation region (not shown) in its place after removal. A patterned masking layer 22, e.g., a patterned layer of photoresist, with an opening 22A is formed on the device 10.

In earlier generation devices, the dimensions of the fins 13 and the width of the trenches 17 were such that one or more etching processes could be performed though the opening 22A to remove the single fin 15. However, device dimensions have continued to shrink, e.g., the lateral width of the fins 13 may be on the order of about 10 nm or less, and the width of the trenches 17 may be on the order of about 20 nm or less. Accordingly, the size 18 of the opening 22A that is needed to remove only the single fin 15 is so small, e.g., 30 nm or less, that an opening 22A with the desired smaller size 18 cannot be formed using a single patterned photoresist masking layer, such as the patterned photoresist layer 22. One possible solution would be to use more complex and expensive double patterning techniques to define a patterned masking layer (typically a hard mask layer) with an opening having the desired size 18. Another possible solution would be to simply increase the number of fins being removed from say one to three, thereby making the size of the opening 18 one that can be formed using a single patterned photoresist masking layer. However, this latter approach would result in undesirable consumption of extremely valuable plot space on the substrate, and be counter to the desire by all integrated circuit manufacturers to increase packing densities and reduce the physical size of the overall final integrated circuit product. The problems discussed above apply equally to the so-called "Fins-cut-First" fin removal process.

The present disclosure is directed to various methods of removing a fin when forming FinFET semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of removing a fin when forming FinFET semiconductor devices. One illustrative method disclosed herein includes, among other things, forming a plurality of fins in a semiconducting substrate, each of which has a corresponding masking layer feature positioned thereabove, forming at least one patterned layer of material above the plurality of fins, wherein the at least one patterned layer of material has an opening that exposes at least two fins of the plurality of fins, and performing an angled etching process through the opening in the at least one patterned layer of material so as to remove the masking layer feature formed above one of the at least two exposed fins, and thereby define an exposed fin, while leaving the masking layer feature intact above the other of the at least two exposed fins. In this embodiment, the method further comprises performing an anisotropic etching process through the opening in the at least one patterned layer of material to remove the exposed fin while leaving the other of the at least two exposed fins intact and forming a layer of insulating material in at least a portion of the space previously occupied by the removed exposed fin.

Another illustrative method includes, among other things, forming a patterned masking layer above a semiconductor substrate, the patterned masking layer comprising a plurality of masking layer features, each of which corresponds to a fin to be formed in the substrate, performing an etching process through the patterned masking layer to define a plurality of trenches in the substrate to thereby define a plurality of fins, each of which has a corresponding masking layer feature positioned thereabove, forming a first layer of insulating material above the patterned masking layer so as to overfill the trenches, forming a patterned layer of photoresist material above the first layer of insulating material and performing an etching process through the opening in the patterned layer of photoresist material so as to define an opening in the first layer of insulating material that exposes at least two fins of the plurality of fins and wherein the opening is formed such that a fin to be removed is positioned adjacent a side of the opening without another fin being positioned therebetween. In this example, the method further comprises performing an angled etching process through the opening in the first layer of insulating material so as to remove the masking layer feature formed above one of the at least two exposed fins, and thereby define an exposed fin that is to be removed, while leaving the masking layer feature intact above the other of the at least two exposed fins, performing an anisotropic etching process through the opening in the first layer of insulating material to remove the exposed fin while leaving the other of the at least two exposed fins intact and forming a second layer of insulating material in at least a portion of the space previously occupied by the removed exposed fin.

Another illustrative method includes, among other things, forming a patterned masking layer above a semiconductor substrate, the patterned masking layer comprising a plurality of masking layer features, each of which corresponds to a fin to be formed in the substrate, forming at least one patterned layer of material above the patterned masking layer, wherein the at least one patterned layer of material has an opening that exposes at least two of the plurality of masking layer features, performing an angled etching process through the opening in the at least one patterned layer of material so as to remove one of the masking layer features while leaving the other of the at least two masking layer features intact and thereby define a modified patterned masking layer, removing the at least one patterned layer of material so as to leave the modified patterned masking layer positioned above the substrate, performing an etching process through the modified patterned masking layer to define a plurality of trenches in the substrate to thereby define a plurality of fins in the substrate and forming a layer of insulating material in the plurality of trenches.

Another illustrative method includes, among other things, forming a patterned masking layer above a semiconductor substrate, the patterned masking layer comprising a plurality of masking layer features, each of which corresponds to a fin to be formed in the substrate, forming a first layer of insulating material above the patterned masking layer, forming a patterned layer of photoresist material above the first layer of insulating material and performing an etching process through the opening in the patterned layer of photoresist material so as to define an opening in the first layer of insulating material that exposes at least two masking layer features, wherein a masking layer feature to be removed is positioned adjacent a side of the opening. In this example, the method further comprises performing an angled etching process through the opening in the first layer of insulating material so as to remove the masking layer feature to be removed while leaving the other of the at least two masking layer features intact and thereby define a modified patterned masking layer, removing the patterned layer of photoresist material and the first layer of insulating material so as to leave the modified patterned masking layer positioned above the substrate, performing an etching process through the modified patterned masking layer to define a plurality of trenches in the substrate to thereby define a plurality of fins in the substrate and forming a second layer of insulating material in the plurality of trenches.

BRIEF DESCRIPTION OF THE DRAWINGS

The disclosure may be understood by reference to the following description taken in conjunction with the accompanying drawings, in which like reference numerals identify like elements, and in which.

Figure 1A:
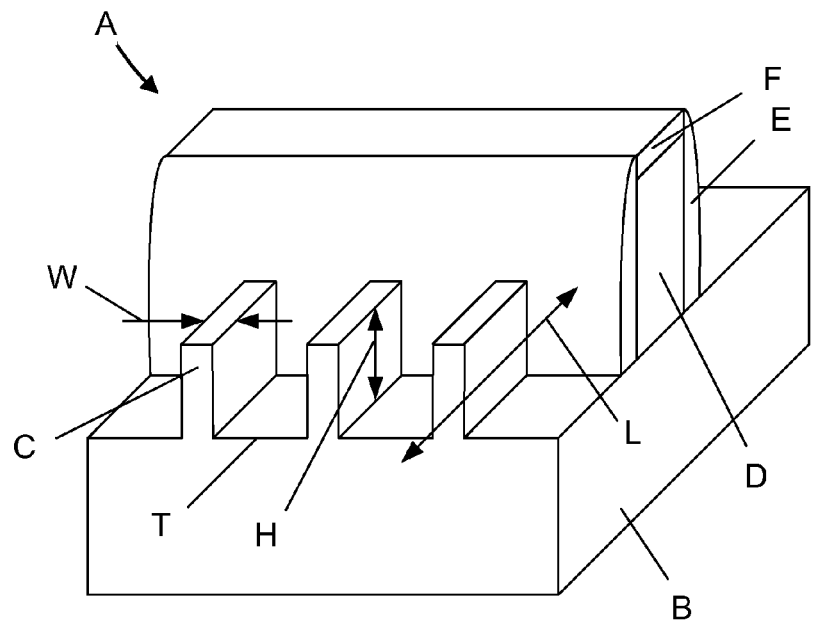
FIG. 1A is a perspective view of one illustrative embodiment of a prior art FinFET device.
Figure 1B:
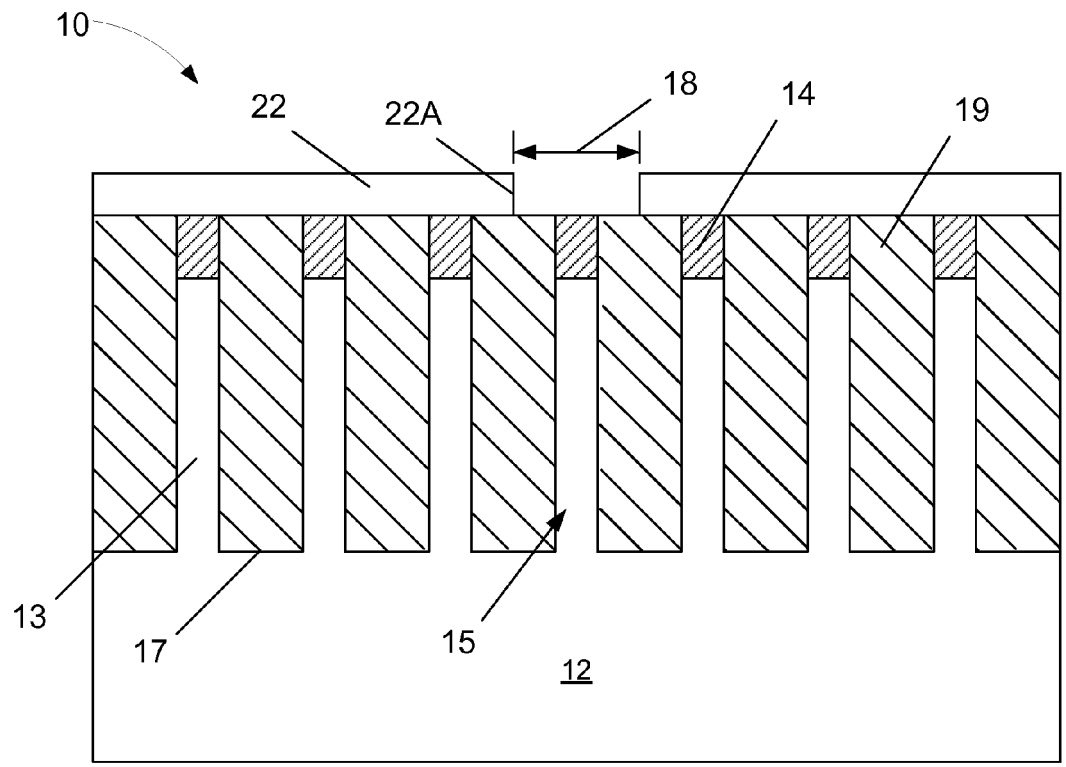
FIG. 1B is a cross-sectional view of one illustrative embodiment of a prior art FinFET device that is provided so as to explain problems that may be encountered when trying to remove a single fin structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of removing a fin when forming FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIGS. 2A-2K depict various illustrative methods disclosed herein for removing a fin when forming FinFET semiconductor devices. As will be recognized by those skilled in the art after a complete reading of the present application, the illustrative FinFET product 100 described herein may be either an N-type FinFET device or a P-type FinFET device. In this illustrative embodiment, the substrate 102 has a bulk semi-conducting material configuration. The substrate 102 may be made of silicon or it may be made of materials other than silicon. Thus, the terms "substrate" or "semiconducting substrate" should be understood to cover all forms of all semiconductor materials.

Figure 2A:
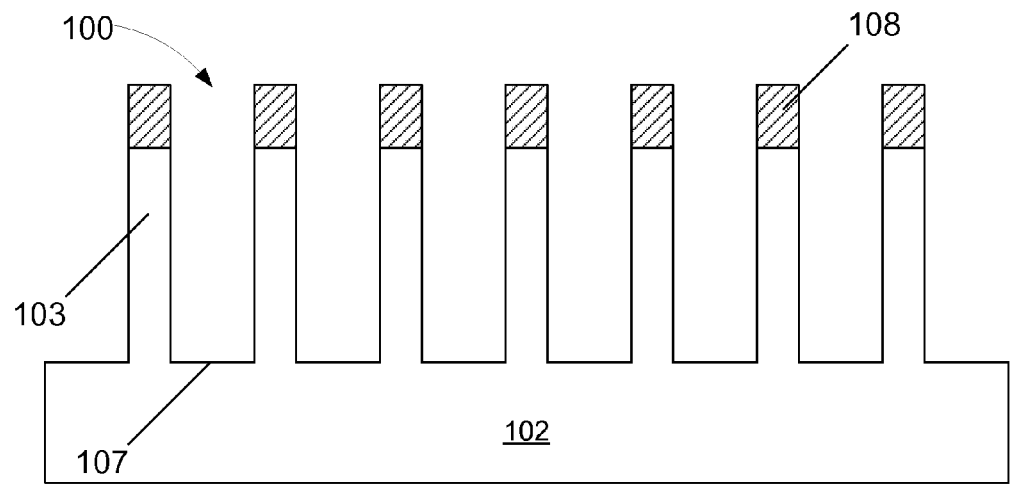
FIGS. 2A-2K depict various illustrative methods disclosed herein for removing a fin when forming FinFET semiconductor devices.

FIG. 2A is a simplified view of an illustrative FinFET semiconductor product 100 at an early stage of manufacturing. FIG. 2A depicts the product 100 after a patterned masking layer 108, e.g., a patterned hard mask layer, comprised of a plurality of masking layer features has been formed above the substrate 102. The pattern in the patterned masking layer 108 corresponds to the desired pattern of fins to be formed in the substrate 102. FIG. 2A also depicts the product 100 after an etching process was performed through the patterned masking layer 108 to define a plurality of trenches 107 in the substrate 102. The trenches 107 define a plurality of fins 103.

The patterned masking layer 108 is intended to be representative in nature as it may be comprised of a variety of materials, such as, for example, a photoresist material, silicon nitride, silicon oxynitride, etc. Moreover, the patterned masking layer 108 may be comprised of multiple layers of material, such as, for example, a silicon nitride layer and a layer of silicon dioxide. The patterned masking layer 108 may be formed by depositing the layer(s) of material that comprise the masking layer 108 and thereafter directly patterning the masking layer 108 using known photolithography and etching techniques. Alternatively, the patterned masking layer 108 may be formed by using known sidewall image transfer techniques. Thus, the particular form and composition of the patterned masking layer 108 and the manner in which it is made should not be considered a limitation of the present invention. In the case where the patterned masking layer 108 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

The fins 103 may be formed to any desired height or width. In the illustrative example depicted in the attached figures, the trenches 107 and the fins 103 are all of a uniform size and shape. However, such uniformity in the size and shape of the trenches 107 and the fins 103 is not required to practice at least some aspects of the inventions disclosed herein. In the example depicted herein, the trenches 107 are depicted as having been formed by performing a plurality of anisotropic etching processes. In some cases, the trenches 107 may have a reentrant profile near the bottom of the trenches 107. To the extent the trenches 107 are formed by performing a wet etching process, the trenches 107 may tend to have a more rounded configuration or non-linear configuration as compared to the generally linear configuration of the trenches 107 that are formed by performing an anisotropic etching process. In other cases, the trenches 107 may be formed in such a manner that the fins 103 have a tapered cross-sectional configuration (wider at the bottom than at the top at this point in the process flow). Thus, the size and configuration of the trenches 107, and the manner in which they are made, should not be considered a limitation of the present invention.

Figure 2B:
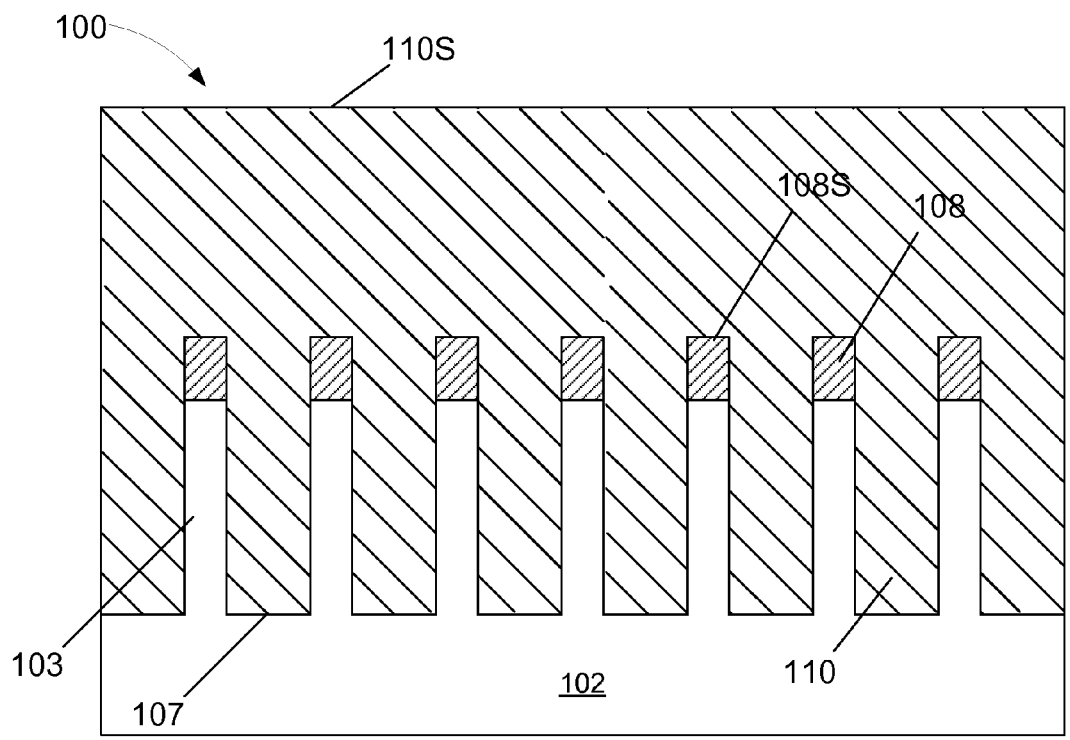

FIG. 2B depicts the product 100 after a layer of insulating material 110, such as silicon dioxide, was formed so as to overfill the final trenches 107. A chemical mechanical polishing (CMP) process was then performed to planarize the upper surface of the insulating material 110. In one illustrative embodiment, the layer of insulating material 110 has an upper surface 110S that is positioned above the upper surface 108S of the patterned masking layer by a distance of at least about 50 nm, for the illustrative example where the opening to be formed in the layer of insulating material 110, as described more fully below, exposes three of the fins where the fin pitch is about 30 nm and the fin width is about 10 nm. Of course, as these parameters vary, the thickness of the layer of insulating material 110 may also vary.

Figure 2C:
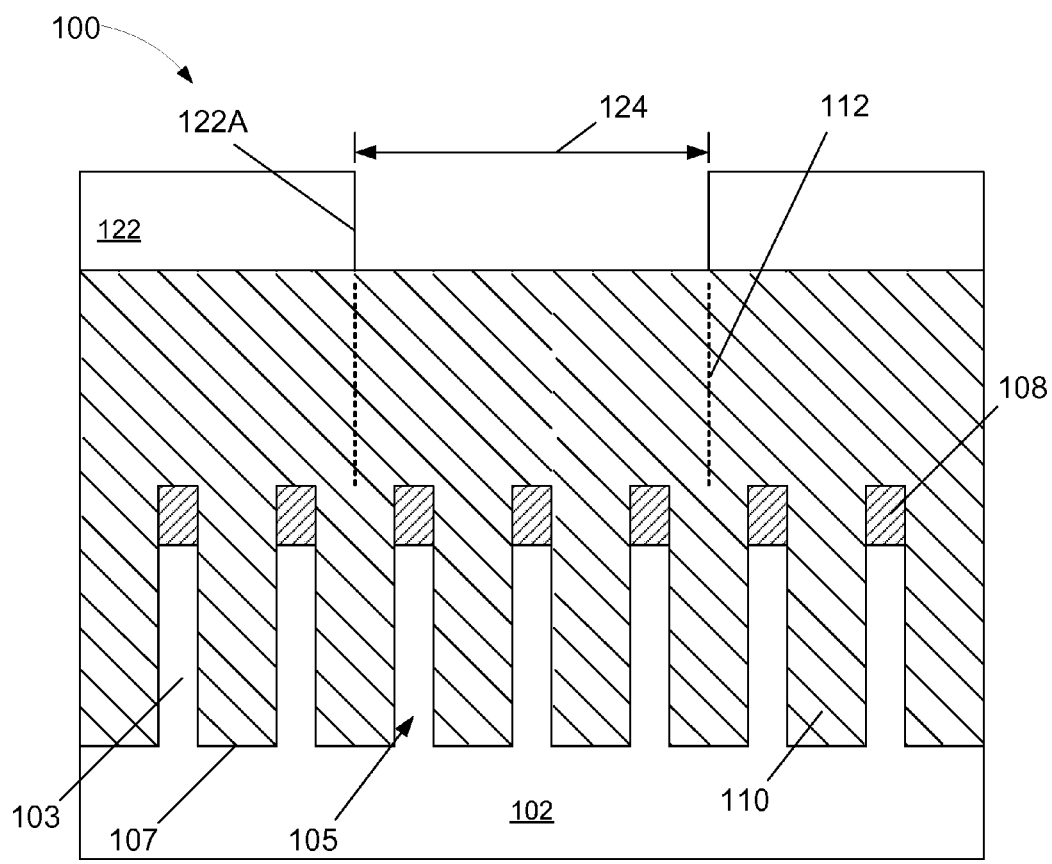

FIG. 2C depicts the product 100 after a patterned masking layer, e.g., a patterned layer of photoresist 122, has been formed above the layer of insulating material 110. The patterned layer of photoresist 122 has an opening 122A formed therein. In the depicted example, the opening 122A has a size 124 that is adapted for use in exposing three of the illustrative fins 103, as reflected by the dashed-lines 112. In the example described herein, only a single fin 105 will eventually be removed. As will be appreciated by those skilled in the art after a complete reading of the present application, the lateral size 124 of the opening 122A may be large enough so as to be used to expose at least two fins 103. That is, in the methods disclosed herein, the opening 122A could be large enough so as to expose 2, 3, 5 or 7 fins, or an even greater number of fins.

Figure 2D:
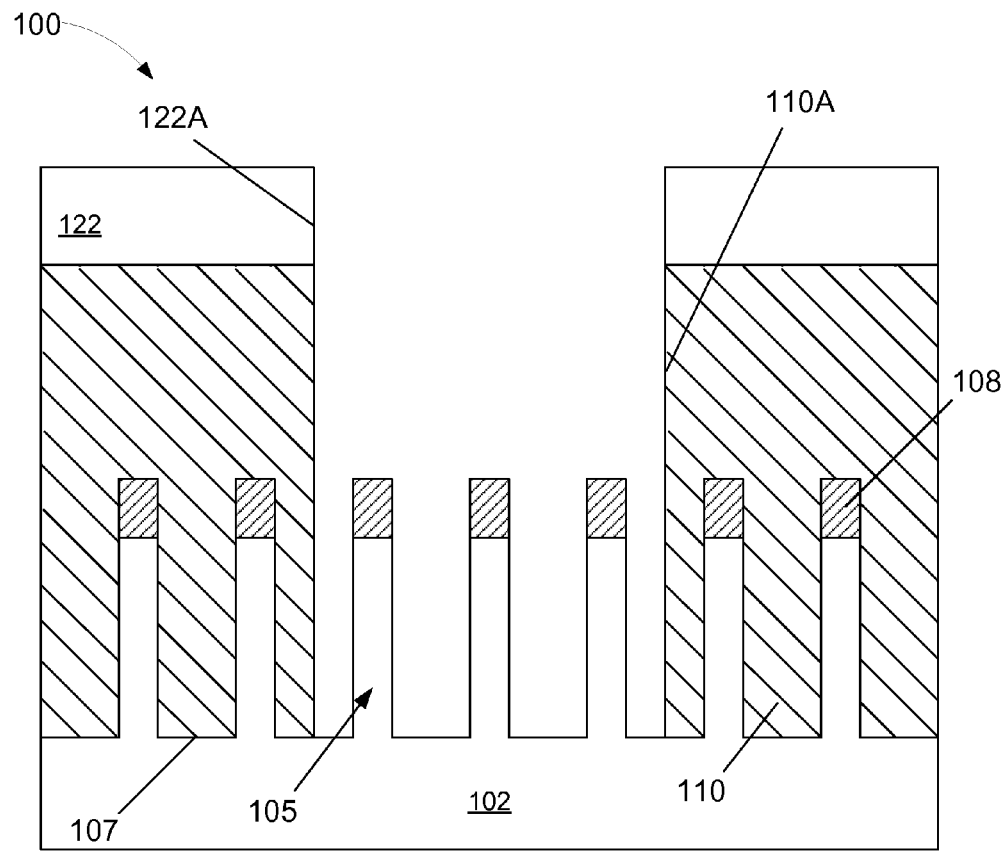

FIG. 2D depicts the product 100 after an anisotropic etching process was performed though the patterned masking layer 122 to define an opening 110A in the layer of insulating material 110 that exposes the fin 105 to be removed and two additional fins 103 (in this example). As noted above, the process disclosed herein may be employed where the fin 105 to be removed and at least one additional fin 103 are exposed by the opening 110A. It should be noted that, using the methods disclosed herein, the opening 110A should be formed such that the fin 105 to be removed is positioned adjacent one of the sides of the opening 110A, i.e., another fin 103 is not positioned between the fin 105 to be removed and the side of the opening 110A. Of course, as will be clear after the discussion below, the fin 105 to be removed, may be positioned adjacent either side of the opening 110A. Collectively, the patterned masking layer 122 and the patterned layer of insulating material 110 may be thought of as a patterned masking layer that exposes the desired number of fins, including the fin 105.

Figure 2E:
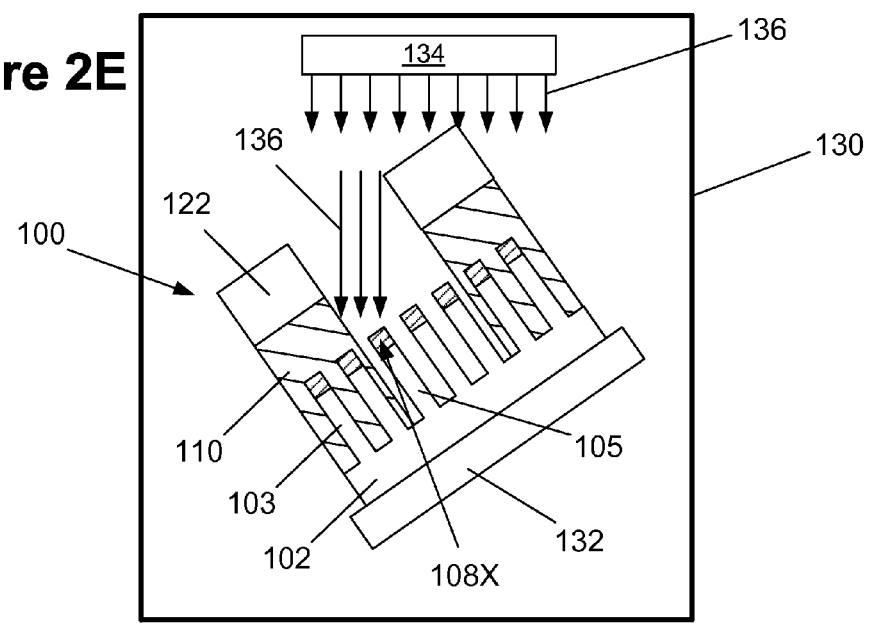
Figure 2F:
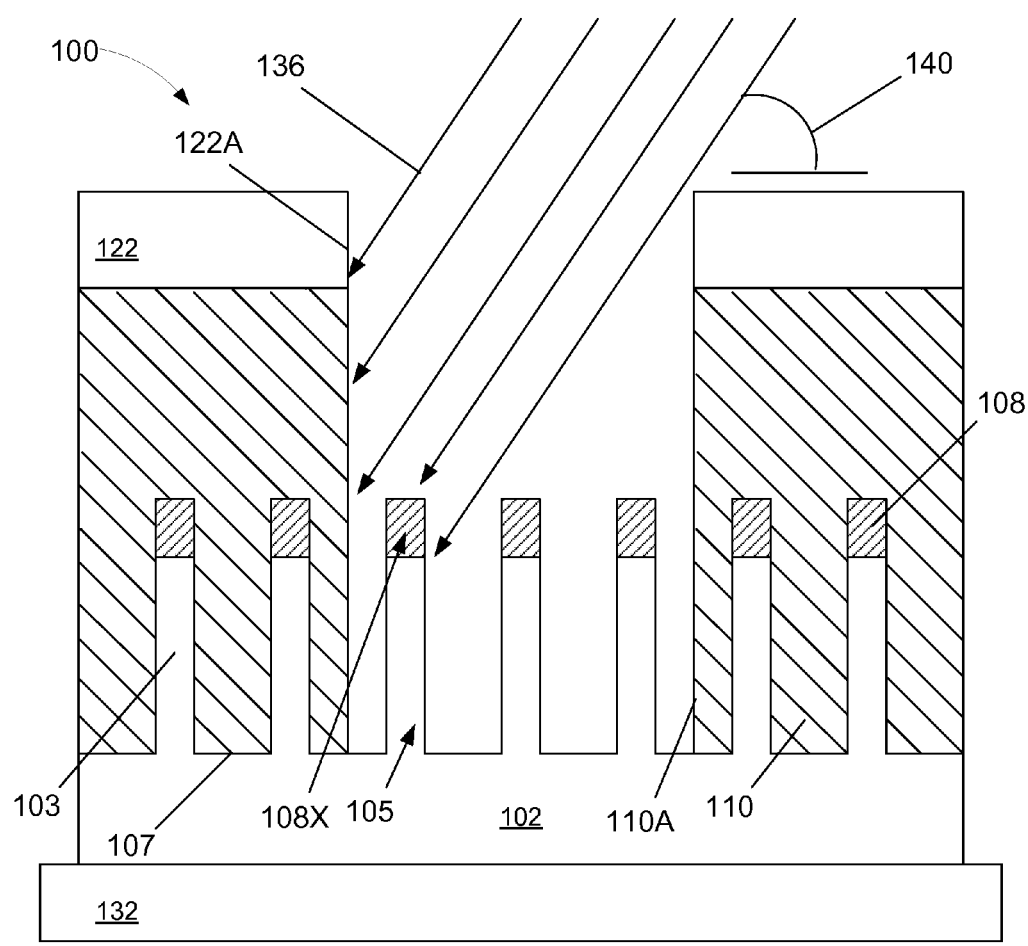

With reference to FIGS. 2E and 2F, the methods disclosed herein generally involve performing one or more etching processes at an angle so as to selectively remove the masking layer feature 108X of the patterned masking layer 108 that is positioned above the fin 105 to be removed, while leaving the remaining masking layer features of the patterned masking layer 108 substantially intact. This is accomplished by taking advantage of the shading provided by the patterned mask layer 122 and/or the layer of insulating material 110, with the opening 110A formed therein, during the angled etching process. The angled etching process is a relative angled etching process. That is, the angle of the angled etching process may be performed by rotating the substrate 102 (i.e., the product 100) relative to a source of etching ions or vice-versa.

FIG. 2E reflects an example wherein the substrate 102 is rotated relative to a source 134 of etching ions 136 that, absent such rotation, would normally be directed in a direction that is substantially normal to the upper planar surface of the substrate 102. More specifically, FIG. 2E depicts an embodiment wherein the product 100 is positioned in a schematically depicted processing chamber 130 of an etching tool. The product 100 is positioned on a rotatable stage 132, the structure and function of which are well known to those skilled in the art. The chamber 130 includes the source 134 of the etching ions 136. In one illustrative embodiment, the etching process performed in the etching chamber 130 is an anisotropic ion etching process that directs the ions 136 away from the source 134 in a direction that is approximately normal relative to the source 134. Due to the rotation of the product 100, via the rotation of the wafer stage 132, the etching ions 136 are directed at a relative angle 140 (see FIG. 2F) relative to a horizontal surface, such as the upper surface of the substrate 102. As depicted in FIGS. 2E and 2F, due to the shadowing from the patterned masking layer 122, only the masking layer feature 108X is exposed to the etching ions 136. In another embodiment, the masking layer 122 may be removed prior to performing the angled etching process. In such a case, the shadowing would be provided by the patterned layer of insulating material 110 with the opening 110A formed therein. In this situation, the angle 140 might be greater due to the removal of the patterned masking layer 122. FIG. 2F depicts the product 100 wherein the substrate 102 is depicted as being oriented such that its upper surface is oriented in a substantially horizontal plane, the ions 136 are directed through the patterned masking layer 122 and the patterned layer of insulating material 110 at an angle 140. In one illustrative embodiment, the angled etching process may be performed at a relative angle 140 that ranges between 10-80 degrees. Of course, the value of the angle 140 may vary depending upon the particular application.

Figure 2G:
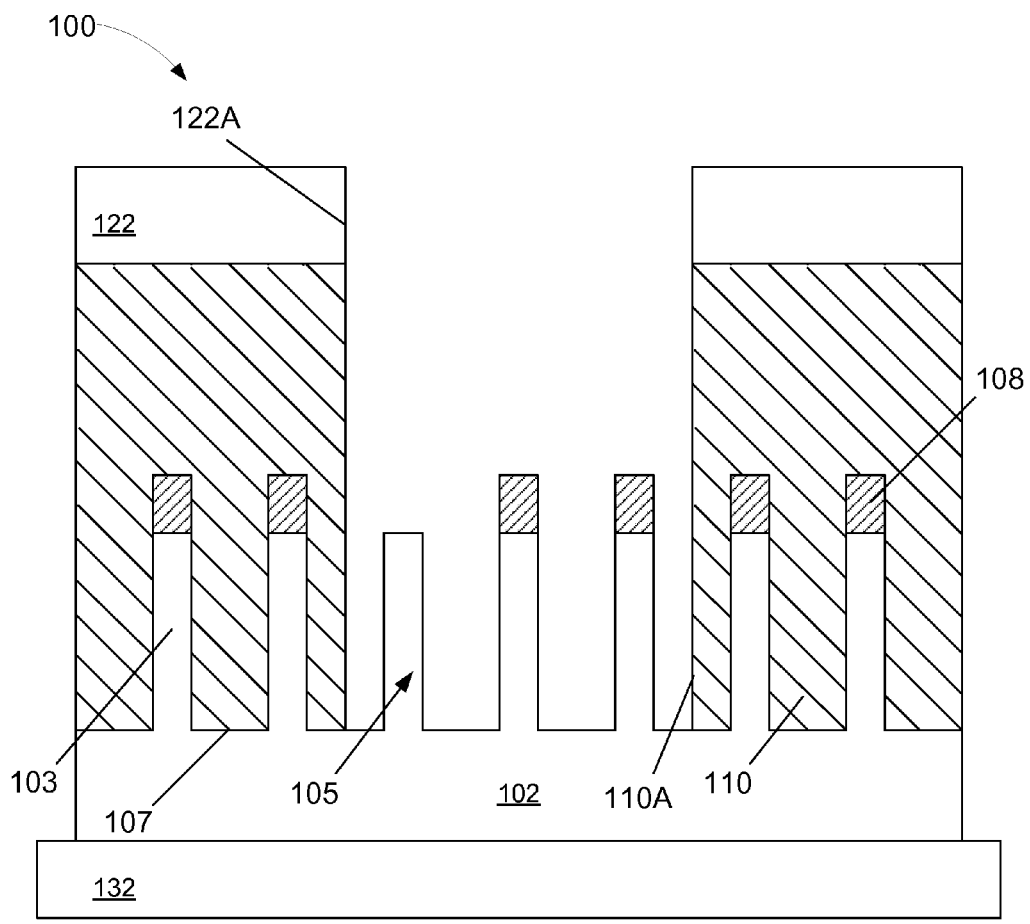

FIG. 2G depicts the product 100 at the completion of the angled etching process described above. As shown, the masking layer feature 108X has been removed from above the fin 105 to be removed while the remaining masking layer features of the patterned masking layer 108 remain substantially intact due to the previously-described shadowing during the angle etching process.

Figure 2H:
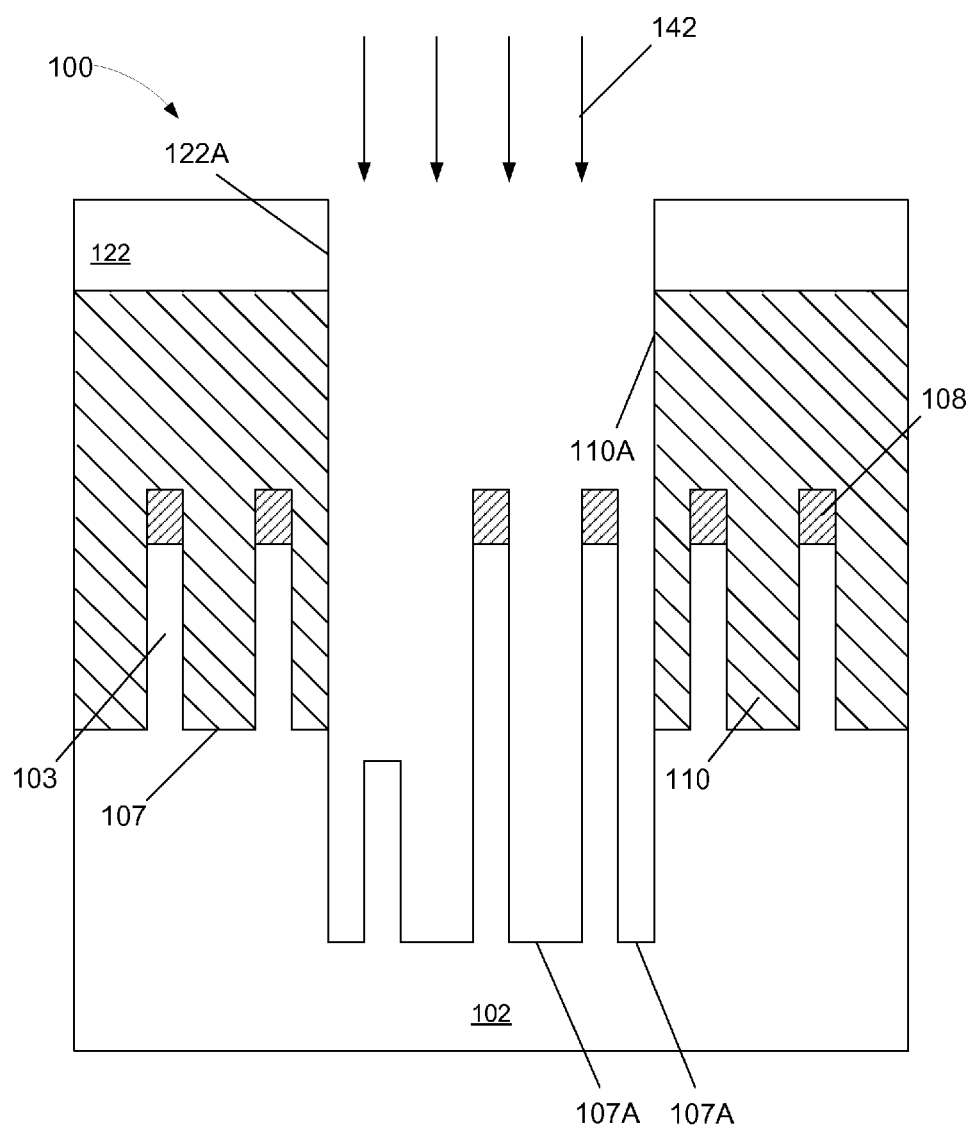

FIG. 2H depicts the product 100 after a timed, anisotropic reactive ion etching process 142 was performed through the patterned masking layer 122. The etching process 142 is designed such that the etching ions are directed toward the substrate 102 in a direction that is substantially normal to the upper surface of the substrate 102. Accordingly, the exposed portions of the substrate material, i.e., the exposed fin 105 and the trenches 107 between the fins 103, are subjected to the etching process. The two other fins 103 exposed within the opening 110A are protected from the etching process 142 by the remaining features of the masking layer 108. As depicted, at the end of the etching process 142, the fin 105 has been removed and the depth of the original trenches 107 within the opening 110A has been increased so as to thereby define deeper trenches 107A in the substrate 102. The depth of the trenches 107A may vary depending upon the particular application. Note, in FIG. 2H and later drawings, more of the substrate 102 is shown so as to depict the effects of the above-described etching process 142.

Figure 2I:
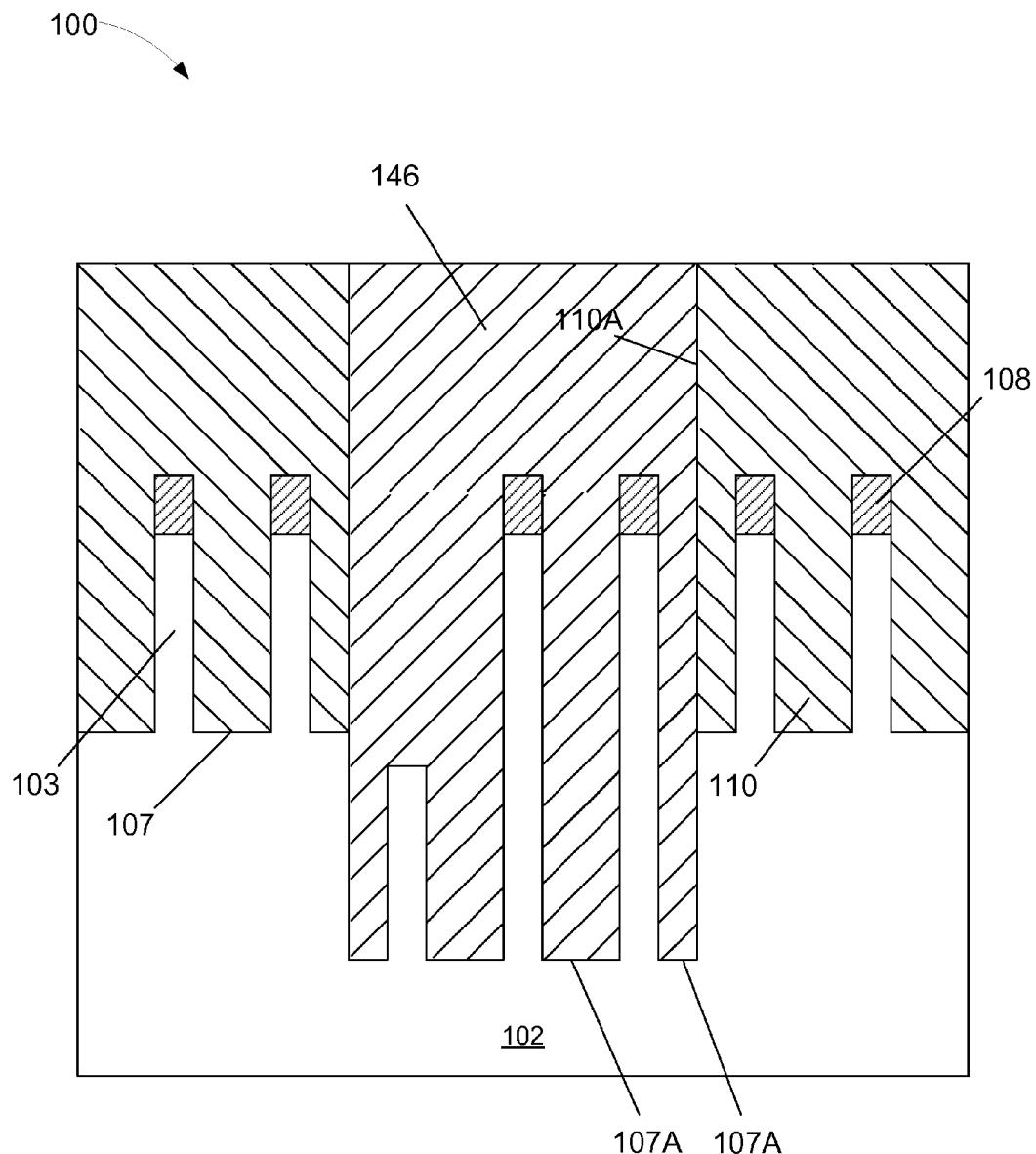

FIG. 2I depicts the product 100 after the patterned masking layer 122 was removed and after another layer of insulating material 146, such as silicon dioxide, was formed so as to overfill the opening 110A in the layer of insulating material 110. A chemical mechanical polishing (CMP) process was then performed to planarize the upper surface of the insulating material 146 with the upper surface of the layer of insulating material 110

Figure 2J:
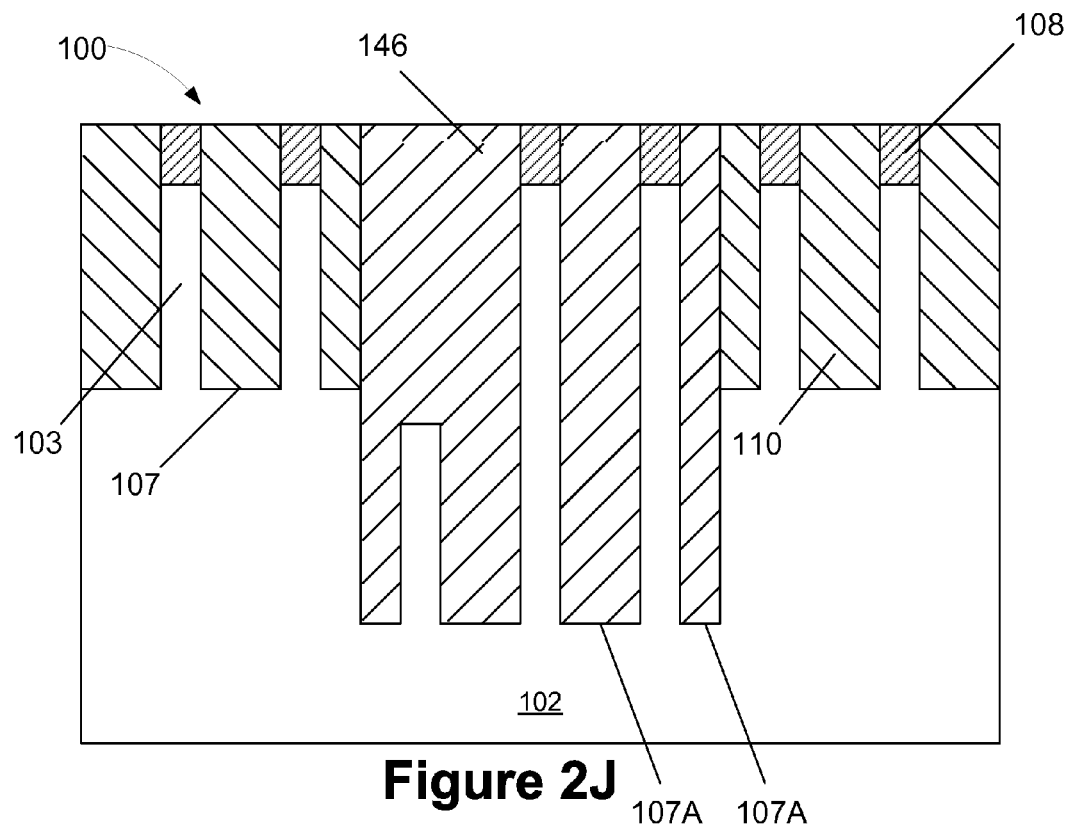

FIG. 2J depicts the product 100 after a chemical mechanical polishing (CMP) process was performed to planarize the upper surfaces of the layers of insulating material 110, 146 with the upper surfaces of the remaining features of the patterned hard mask 108. If desired, the CMP steps in FIGS. 2I-2J may be performed in a single CMP process operation.

Figure 2K:
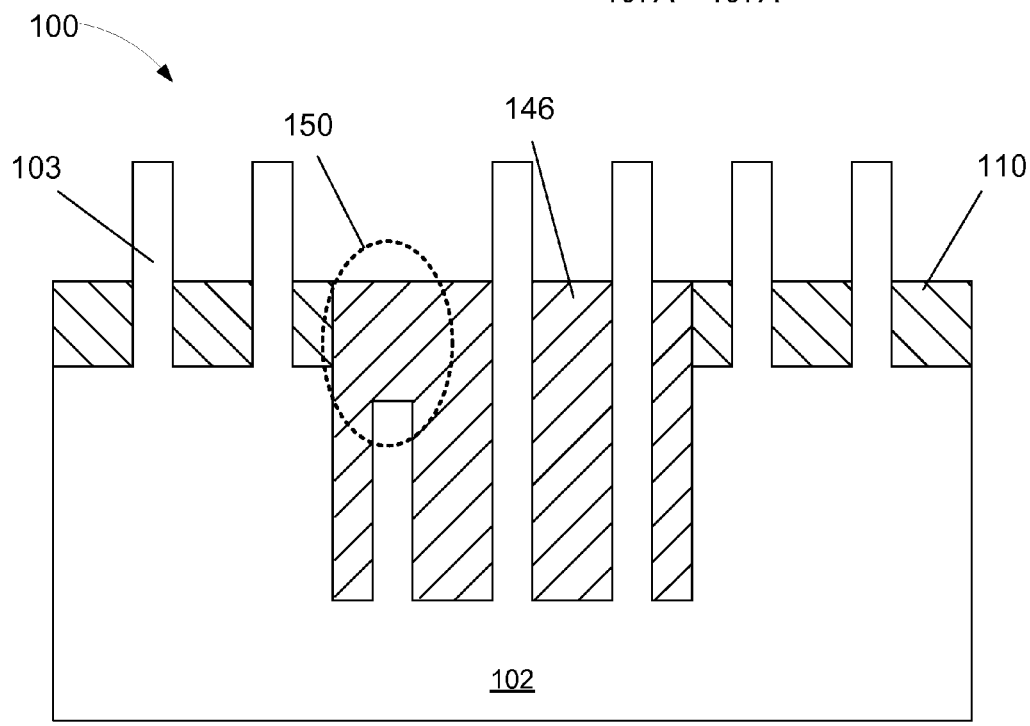

FIG. 2K depicts the product 100 after a timed, recess etching process was performed on the layers of insulating material 110, 146 so as to expose the fins 103 to their final desired height. Additionally, the patterned hard mask layer 108 was removed by performing a selective etching process. As depicted, the methods disclosed herein allow formation of an isolation region 150 by removing a single fin 105 by performing the above-described angled etching process through an opening that was formed using a single patterned layer of photoresist material 122. At the point of processing depicted in FIG. 2K, traditional manufacturing operations may be performed to complete the fabrication of FinFET devices on the product 100. For example, gate structures (not shown) for the FinFET devices may be formed using either gate-first or gate-last manufacturing techniques. The gate structures will comprise a gate insulation material and a gate electrode positioned around at least a portion of the exposed portions of the fins 103.

FIGS. 3A-3H depict other illustrative methods disclosed herein for preventing the formation of a fin when forming FinFET semiconductor devices. In this embodiment, the methods disclosed herein will be employed to remove a masking layer feature (corresponding to the fin to be removed) from a patterned masking layer prior to performing an etching process through the modified patterned masking layer to define the trenches 107 in the substrate 102 that define the fins 103.

Figure 3A:
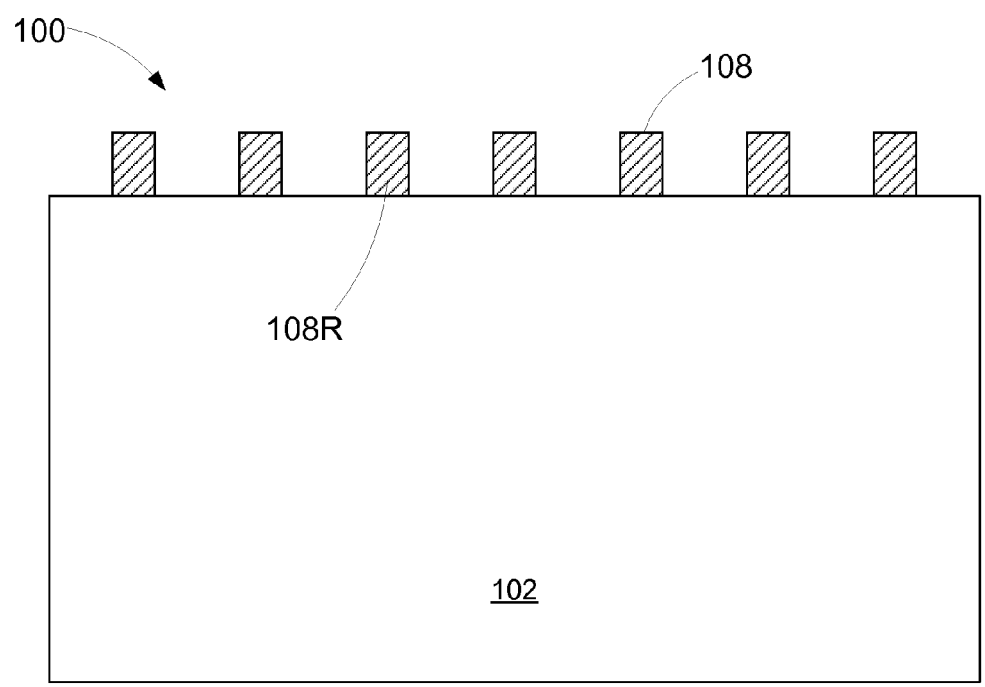
FIGS. 3A-3H depict other illustrative methods disclosed herein for preventing the formation of a fin when forming FinFET semiconductor devices.

FIG. 3A depicts the product 100 at a point in time wherein the above-described patterned masking layer 108 was formed above the substrate 102. The patterned masking layer 108 has a masking layer feature 108R that corresponds to the fin that is desired to be not formed in the substrate.

Figure 3B:
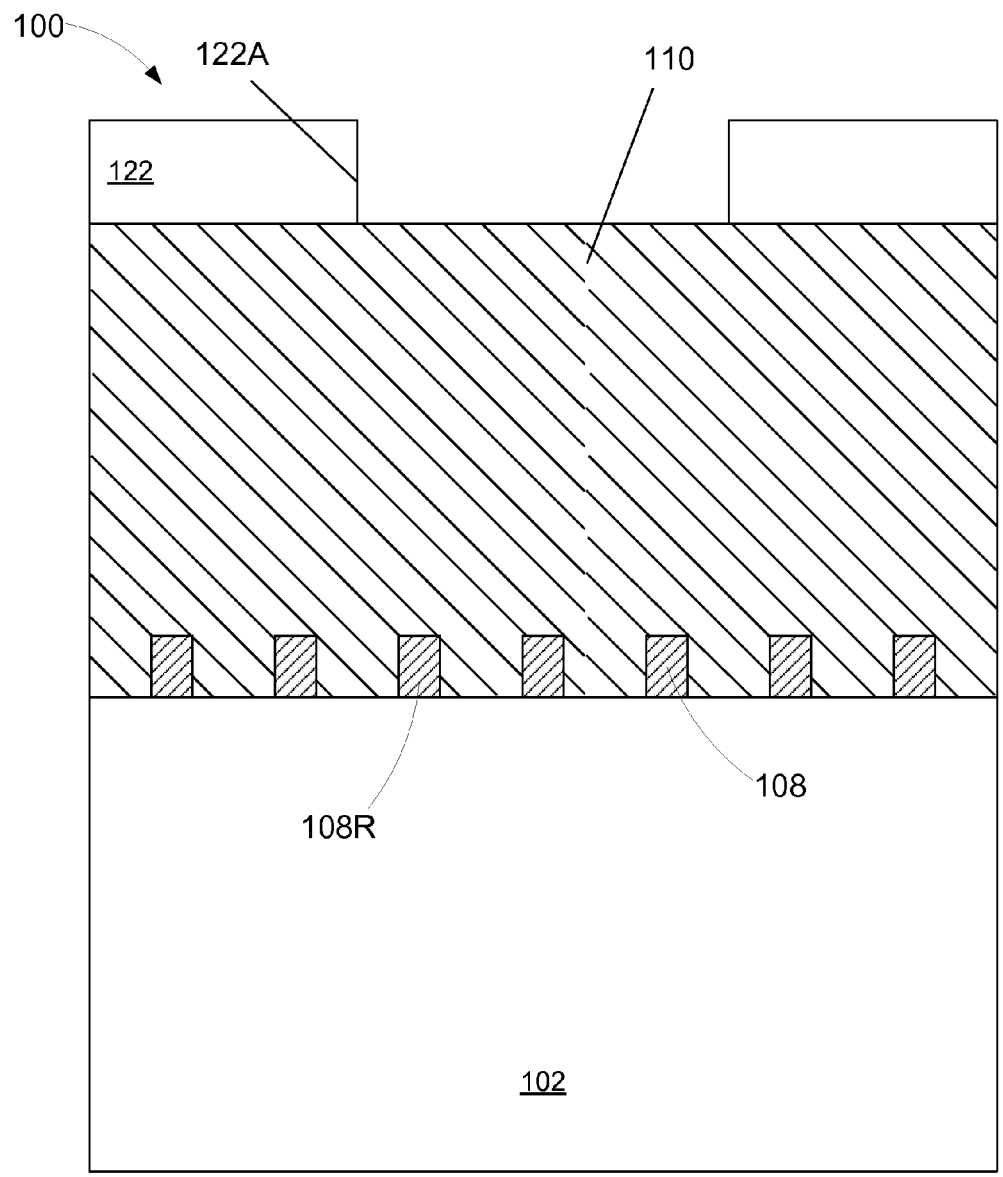

FIG. 3B depicts the product after the above-described layer of insulating material 110 and the above-described patterned masking layer 122 were formed on the product above the patterned masking layer 108.

Figure 3C:
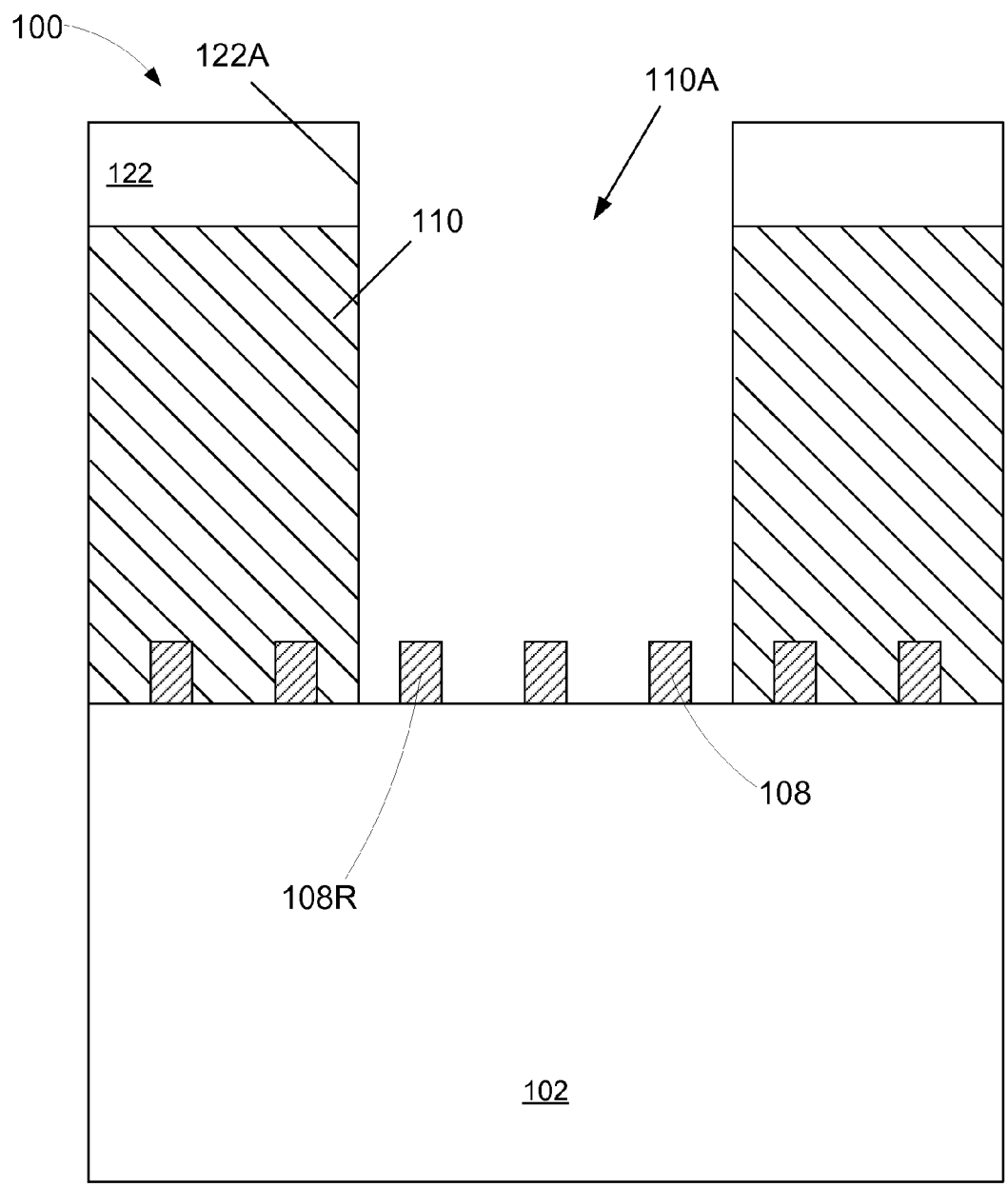

FIG. 3C depicts the product 100 after an etching process was performed through the patterned masking layer 122 to define the opening 110A in the layer of insulating material 110. Note that the opening 110A is located such that the masking layer feature 108R is positioned adjacent a side of the opening 110A.

Figure 3D:
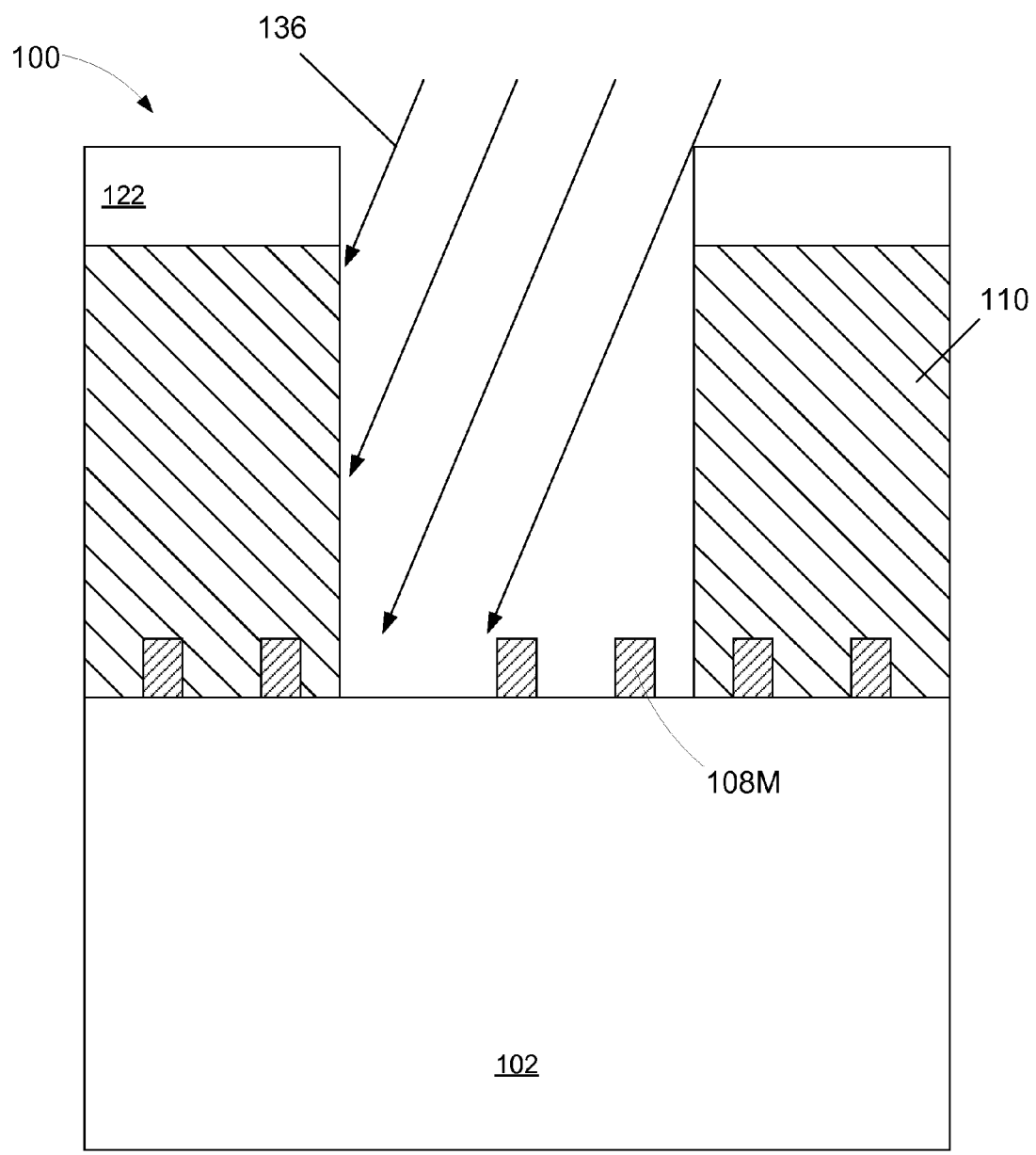

FIG. 3D depicts the product 100 at the completion of the above-described angled etching process 136. As shown, the masking layer feature 108R has been removed from the original patterned masking layer 108 while the remaining masking layer features of the original patterned masking layer 108 exposed within the opening 110A remain substantially intact due to the previously-described shadowing during the angle etching process. By removing the masking layer feature 108R, a modified patterned masking layer 108M is formed.

Figure 3E:
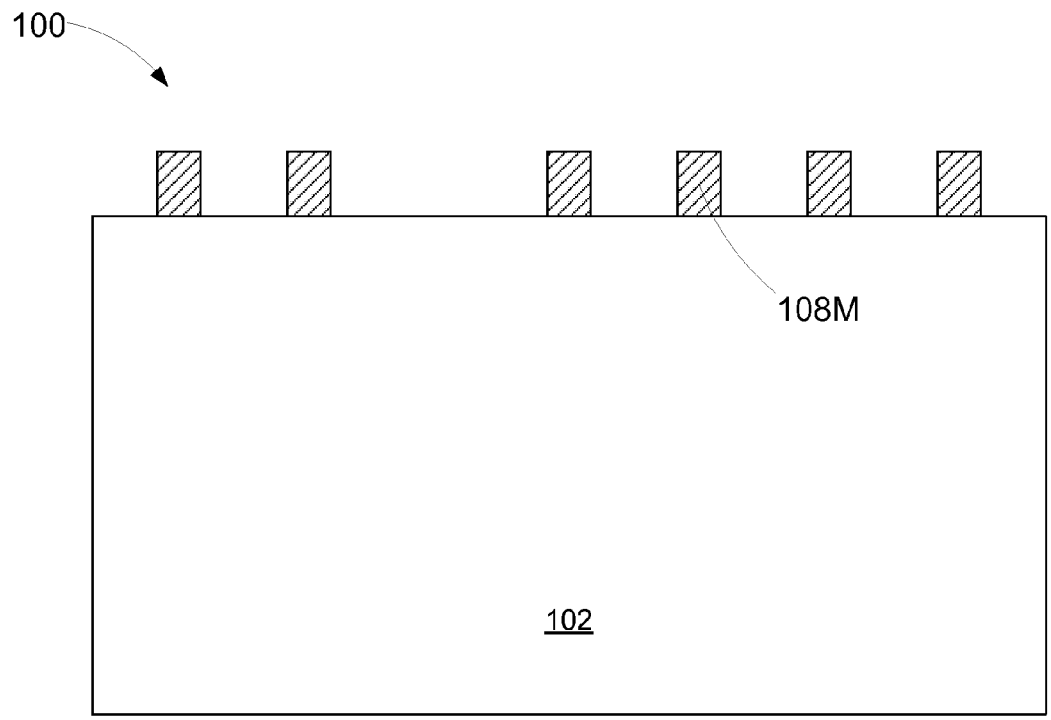

FIG. 3E depicts the product 100 after the patterned masking layer 122 and the layer of insulating material 110 were removed from the product, thereby leaving the modified patterned masking layer 108M positioned above the substrate 102.

Figure 3F:
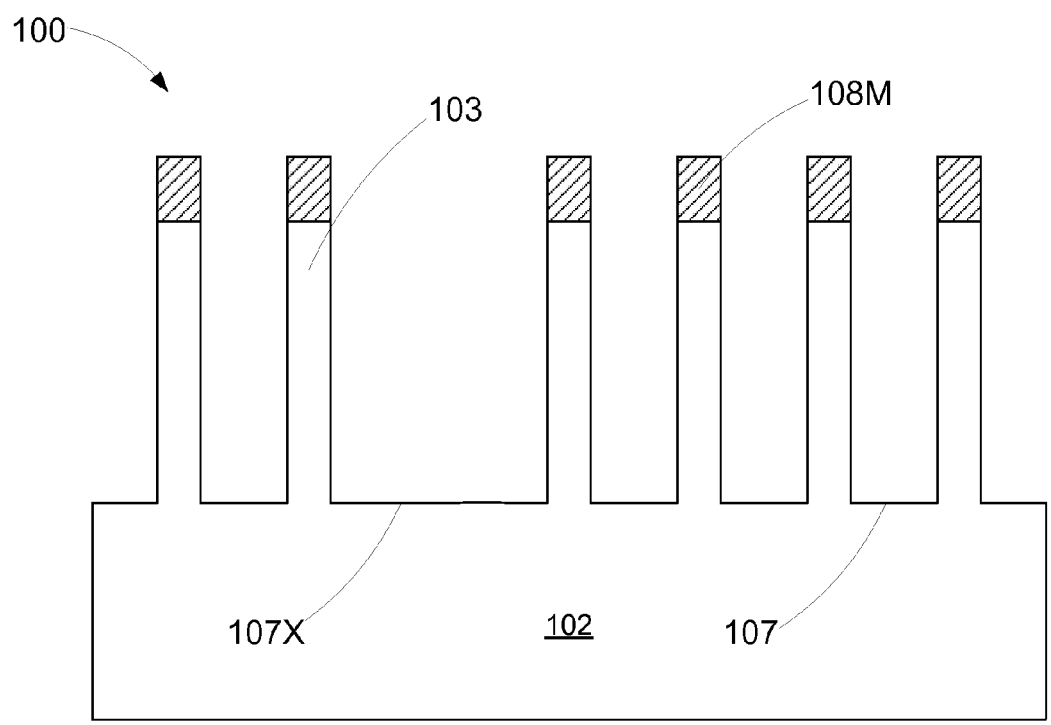

FIG. 3F depicts the product 100 after an etching process was performed through the modified patterned masking layer 108M to define a plurality of 107 in the substrate 102. The trenches 107 define a plurality of fins 103. Note that, due to the removal of the masking layer feature 108R from the original patterned masking layer 108, a corresponding wider trench 107X is formed in the area that would have been occupied by a fin if the processes described herein were not performed.

Figure 3G:
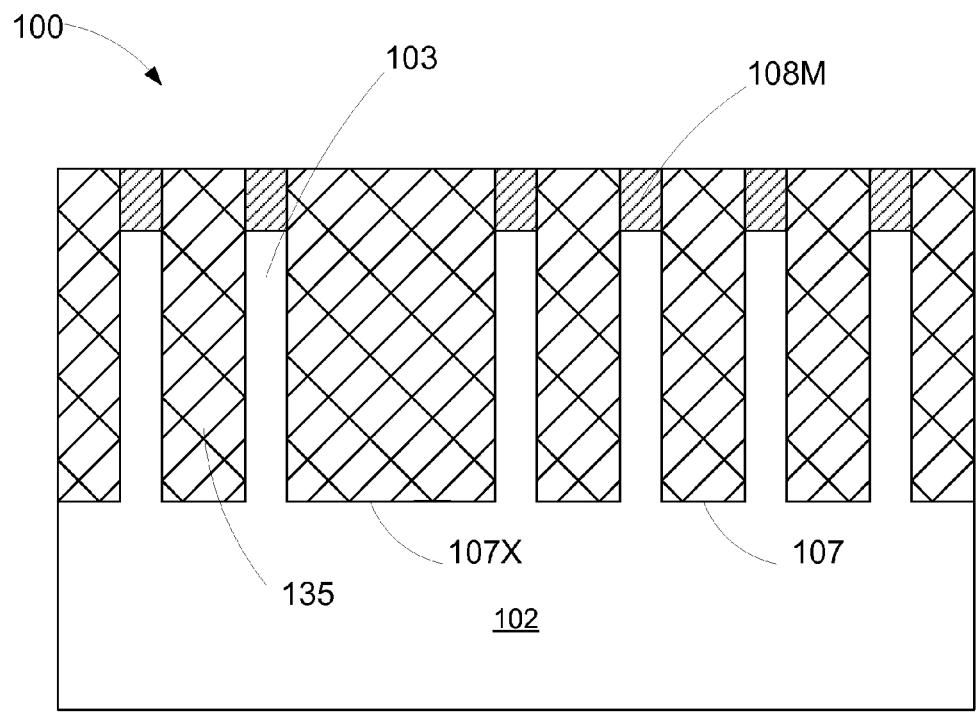

FIG. 3G depicts the product 100 after another layer of insulating material 135, such as silicon dioxide, was formed so as to overfill the trenches 107, 107X, and after a chemical mechanical polishing (CMP) process was then performed to planarize the upper surface of the insulating material 135 with the upper surface of the modified patterned masking layer 108M.

Figure 3H:
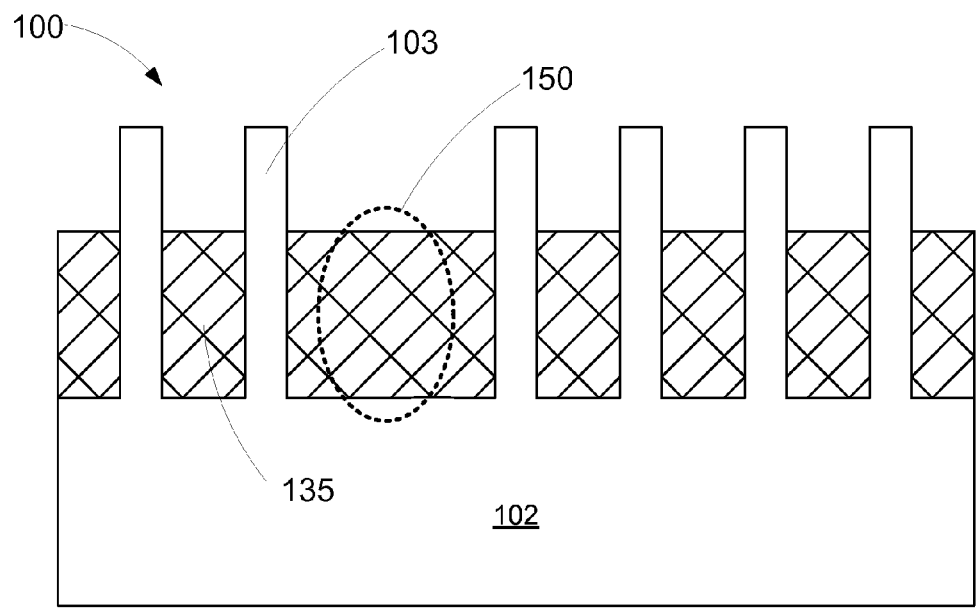

FIG. 3H depicts the product 100 after a timed, recess etching process was performed on the layer of insulating material 135 so as to expose the fins 103 to their final desired height. Additionally, the modified patterned hard mask layer 108M was removed by performing a selective etching process, although the removal of the masking layer 108M may not be performed in all applications. As depicted, the methods disclosed herein allow formation of the isolation region 150 by effectively preventing formation of a single fin by performing the above-described angled etching process through an opening that was formed using a single patterned layer of photoresist material 122. At the point of processing depicted in FIG. 3H, traditional manufacturing operations may be performed to complete the fabrication of FinFET devices on the product 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-fled and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fins in a semiconducting substrate, each of which has a corresponding masking layer feature positioned thereabove;
    forming at least one patterned layer of material above said plurality of fins, wherein said at least one patterned layer of material has an opening that exposes at least two fins of said plurality of fins;
    performing an angled etching process through said opening in said at least one patterned layer of material so as to remove said masking layer feature formed above one of said at least two exposed fins, and thereby define an exposed fin, while leaving said masking layer feature intact above the other of said at least two exposed fins;
    performing an anisotropic etching process through said opening in said at least one patterned layer of material to remove said exposed fin while leaving the other of said at least two exposed fins intact; and
    forming a layer of insulating material in at least a portion of the space previously occupied by the removed exposed fin.

2. The method of claim 1, wherein forming said at least one patterned layer of material above said plurality of fins comprises forming said at least one patterned layer of material such that said patterned layer of material has an opening that exposes three or more fins of said plurality of fins.

3. The method of claim 1, wherein forming said at least one patterned layer of material above said plurality of fins comprises forming said at least one patterned layer of material such that the fin to be exposed is positioned adjacent a side of said opening without another fin being positioned therebetween.

4. The method of claim 1, wherein performing said angled etching process comprises rotating said substrate relative to a source of etching ions in a process chamber so as to perform said angled etching process at a desired angle.

5. The method of claim 1, wherein performing said angled etching process comprises rotating a source of etching ions in a process chamber relative to said substrate so as to perform said angled etching process at a desired angle.

6. The method of claim 1, wherein performing said angled etching process comprises performing said angled etching process at an angle of between 10-80 degrees, inclusive, relative to an upper surface of said substrate.

7. The method of claim 1, wherein forming said at least one patterned layer of material above said plurality of fins comprises:
 forming a layer of insulating material above said patterned layer of material;
 forming a patterned layer of photoresist material above said layer of insulating material; and
 performing an etching process through said opening in said patterned layer of photoresist material so as to define an opening in said layer of insulating material that exposes said at least two fins.

8. The method of claim 7, wherein said angled etching process is performed with said patterned layer of photoresist material in position above said layer of insulating material.

9. The method of claim 1, further comprising performing a recess etching process on at least said layer of insulating material so as to thereby define an isolation structure positioned between two of said plurality of fins.

10. A method, comprising:
 forming a patterned masking layer above a semiconductor substrate, said patterned masking layer comprising a plurality of masking layer features, each of which corresponds to a fin to be formed in said substrate;
 performing an etching process through said patterned masking layer to define a plurality of trenches in said substrate to thereby define a plurality of fins, each of which has a corresponding masking layer feature positioned thereabove;
 forming a first layer of insulating material above said patterned masking layer so as to overfill said trenches;
 forming a patterned layer of photoresist material above said first layer of insulating material;
 performing an etching process through an opening in said patterned layer of photoresist material so as to define an opening in said first layer of insulating material that exposes at least two fins of said plurality of fins and wherein said opening in said first layer of insulating material is formed such that a fin to be removed is positioned adjacent a side of said opening without another fin being positioned therebetween;
 performing an angled etching process through said opening in said first layer of insulating material so as to remove said masking layer feature formed above one of said at least two exposed fins, and thereby define an exposed fin that is to be removed, while leaving said masking layer feature intact above the other of said at least two exposed fins;
 performing an anisotropic etching process through said opening in said first layer of insulating material to remove said exposed fin while leaving the other of said at least two exposed fins intact; and
 forming a second layer of insulating material in at least a portion of the space previously occupied by the removed exposed fin.

11. The method of claim 10, wherein said angled etching process is performed with said patterned layer of photoresist material in position above said layer of insulating material.

12. The method of claim 10, further comprising performing a recess etching process on at least said second layer of insulating material so as to thereby define an isolation structure positioned between two of said plurality of fins.

13. The method of claim 10, wherein performing said anisotropic etching process increases a depth of the initial trenches formed on opposite sides of the other of said at least two exposed fins so as to thereby define increased-depth trenches on opposite sides of the other of said at least two exposed fins.

14. The method of claim 10, wherein said second layer of insulating material is formed in said opening in said first layer of insulating material.

15. A method, comprising:
 forming a patterned masking layer above a semiconductor substrate, said patterned masking layer comprising a plurality of masking layer features, each of which corresponds to a fin to be formed in said substrate;
 forming at least one patterned layer of material above said patterned masking layer, wherein said at least one patterned layer of material has an opening that exposes at least two of said plurality of masking layer features;
 performing an angled etching process through said opening in said at least one patterned layer of material so as to remove one of said at least two masking layer features while leaving the other of said at least two masking layer features intact and thereby define a modified patterned masking layer;
 removing said at least one patterned layer of material so as to leave said modified patterned masking layer positioned above said substrate;
 performing an etching process through said modified patterned masking layer to define a plurality of trenches in said substrate to thereby define a plurality of fins in said substrate; and
 forming a layer of insulating material in said plurality of trenches.

16. The method of claim 15, wherein forming said at least one patterned layer of material above said plurality of fins comprises forming said at least one patterned layer of material such that said patterned layer of material has an opening that exposes three or more of said masking layer features.

17. The method of claim 15, wherein forming said at least one patterned layer of material above said plurality of fins comprises forming said at least one patterned layer of material such that said masking layer feature to be removed is positioned adjacent a side of said opening.

18. The method of claim 15, wherein performing said angled etching process comprises rotating said substrate relative to a source of etching ions in a process chamber so as to perform said angled etching process at a desired angle.

19. The method of claim 15, wherein performing said angled etching process comprises rotating a source of etching ions in a process chamber relative to said substrate so as to perform said angled etching process at a desired angle.

20. The method of claim 15, wherein forming said at least one patterned layer of material above said patterned masking layer comprises:

forming a layer of insulating material above said patterned masking layer;

forming a patterned layer of photoresist material above said layer of insulating material; and performing an etching process through an opening in said patterned layer of photoresist material so as to define an opening in said layer of insulating material that exposes said at least two masking layer features.

21. The method of claim 15, wherein said angled etching process is performed with said patterned layer of material in position above said layer of insulating material.

22. The method of claim 15, further comprising performing a recess etching process on at least said layer of insulating material so as to thereby define an isolation structure positioned between two of said plurality of fins.

23. A method, comprising:

forming a patterned masking layer above a semiconductor substrate, said patterned masking layer comprising a plurality of masking layer features, each of which corresponds to a fin to be formed in said substrate;

forming a first layer of insulating material above said patterned masking layer;

forming a patterned layer of photoresist material above said first layer of insulating material;

performing an etching process through an opening in said patterned layer of photoresist material so as to define an opening in said first layer of insulating material that exposes at least two of said masking layer features, wherein a masking layer feature to be removed is positioned adjacent a side of said opening in said first layer of insulating material;

performing an angled etching process through said opening in said first layer of insulating material so as to remove the masking layer feature to be removed while leaving the other of said at least two masking layer features intact and thereby define a modified patterned masking layer;

removing said patterned layer of photoresist material and said first layer of insulating material so as to leave said modified patterned masking layer positioned above said substrate;

performing an etching process through said modified patterned masking layer to define a plurality of trenches in said substrate to thereby define a plurality of fins in said substrate; and forming a second layer of insulating material in said plurality of trenches.

24. The method of claim 23, wherein said opening in said first layer of insulating material exposes three or more of said masking layer features.

25. The method of claim 23, wherein performing said angled etching process comprises rotating said substrate relative to a source of etching ions in a process chamber so as to perform said angled etching process at a desired angle.

26. The method of claim 23, wherein performing said angled etching process comprises rotating a source of etching ions in a process chamber relative to said substrate so as to perform said angled etching process at a desired angle.

27. The method of claim 23, wherein said angled etching process is performed with said patterned layer of photoresist material in position above said first layer of insulating material.

28. The method of claim 23, further comprising performing a recess etching process on at least said second layer of insulating material so as to thereby define an isolation structure positioned between two of said plurality of fins.

* * * * *